US009002424B2

(12) United States Patent
Nagasu et al.

(10) Patent No.: US 9,002,424 B2
(45) Date of Patent: Apr. 7, 2015

(54) SUPERCONDUCTING FILM-FORMING SUBSTRATE, SUPERCONDUCTING WIRE, AND SUPERCONDUCTING WIRE MANUFACTURING METHOD

(71) Applicant: Furukawa Electric Co., Ltd., Tokyo (JP)

(72) Inventors: Yoshinori Nagasu, Tokyo (JP); Masaru Higuchi, Tokyo (JP); Hisaki Sakamoto, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 14/236,188

(22) PCT Filed: Feb. 6, 2013

(86) PCT No.: PCT/JP2013/052755
§ 371 (c)(1),
(2) Date: Jan. 30, 2014

(87) PCT Pub. No.: WO2013/157286
PCT Pub. Date: Oct. 24, 2013

(65) Prior Publication Data
US 2015/0038334 A1 Feb. 5, 2015

(30) Foreign Application Priority Data

Apr. 16, 2012 (JP) .................. 2012-092803

(51) Int. Cl.
*H01L 39/24* (2006.01)
*H01B 12/04* (2006.01)
*H01B 13/30* (2006.01)

(52) U.S. Cl.
CPC ............... *H01B 12/04* (2013.01); *H01B 13/30* (2013.01); *H01L 39/24* (2013.01)

(58) Field of Classification Search
CPC . H01L 39/143; H01L 39/248; H01L 39/2419; H01B 12/16
USPC .......... 505/230, 433, 510; 428/157, 699–701; 427/62
See application file for complete search history.

(56) References Cited

U.S. PATENT DOCUMENTS 8,465,793 B2 * 6/2013 Ehrenberg et al. ............... 427/62
8,815,777 B2 * 8/2014 Okayama et al. ............. 505/434

(Continued)

FOREIGN PATENT DOCUMENTS

JP     H0480026     3/1992
JP     H04141913    5/1992

(Continued)

OTHER PUBLICATIONS

International Search Report for PCT Application Serial No. PCT/JP2013/052755, mailed Apr. 2, 2013, 4 pages.

*Primary Examiner* — Colleen Dunn
(74) *Attorney, Agent, or Firm* — Amin, Turocy & Watson, LLP

(57) ABSTRACT

A tape-shaped superconducting film-forming substrate is disclosed, which includes a film-forming face for forming a laminate including a superconducting layer thereon, a rear face that is a face at a side opposite to the film-forming face, a pair of end faces connected to the film-forming face and the rear face, and a pair of side faces connected to the film-forming face, the rear face, and the pair of end faces, in which each of the pair of side faces includes a spreading face that spreads toward an outer side in an in-plane direction of the film-forming face from an edge part of the film-forming face toward the rear face side. A superconducting wire and a superconducting wire manufacturing method are also disclosed.

14 Claims, 6 Drawing Sheets

(56) References Cited

U.S. PATENT DOCUMENTS

| | | | |
|---|---|---|---|
| 2010/0143660 A1* | 6/2010 | Ehrenberg et al. | 428/174 |
| 2011/0218113 A1* | 9/2011 | Miyata et al. | 505/230 |
| 2012/0108436 A1* | 5/2012 | Yamaguchi et al. | 505/230 |
| 2012/0208703 A1* | 8/2012 | Okayama et al. | 505/239 |
| 2012/0238454 A1* | 9/2012 | Yoshizumi et al. | 505/237 |
| 2013/0040821 A1* | 2/2013 | Okayama et al. | 505/239 |
| 2013/0137579 A1* | 5/2013 | Nagasu et al. | 505/150 |
| 2013/0137580 A1* | 5/2013 | Hayase et al. | 505/237 |
| 2013/0137581 A1* | 5/2013 | Higuchi et al. | 505/237 |
| 2014/0287928 A1* | 9/2014 | Ota | 505/434 |

FOREIGN PATENT DOCUMENTS

| | | |
|---|---|---|
| JP | 2004031128 | 1/2004 |
| JP | 2011003494 | 1/2011 |
| JP | 2011009098 | 1/2011 |
| JP | 2011165568 | 8/2011 |

* cited by examiner

SUPERCONDUCTING FILM-FORMING SUBSTRATE, SUPERCONDUCTING WIRE, AND SUPERCONDUCTING WIRE MANUFACTURING METHOD

CROSS-REFERENCE TO RELATED APPLICATIONS

This application is a U.S. National Stage application of PCT Patent Application No. PCT/JP2013/052755, filed Feb. 6, 2013 and entitled "SUBSTRATE FOR SUPERCONDUCTING FILM, SUPERCONDUCTING WIRE, AND SUPERCONDUCTING WIRE FABRICATION METHOD"; which claims priority to Japanese Patent Application No. 2012-092803, filed Apr. 16, 2012. The entireties of the above-referenced applications are incorporated herein by reference.

TECHNICAL FIELD

The present invention relates to a superconducting film-forming substrate, a superconducting wire, and a superconducting wire manufacturing method

BACKGROUND ART

A superconducting wire manufacturing method in which a superconducting wire is obtained by forming a film of a superconducting layer on a film-forming face of a superconducting film-forming substrate having a tape shape and having a rectangular shape of the tape section has hitherto been known.

This kind of manufacturing method has a problem in that a formed layer such as a superconducting layer exfoliates with a corner position between a film-forming face and a side face as the starting point of the exfoliation.

In this regard, Japanese Patent Application Laid-Open (JP-A) No. 2011-165568 discloses a superconducting wire in which a first intermediate layer and a second intermediate layer are disposed on one another in layers in order on a film-forming face of a substrate for forming a superconducting film, and the second intermediate layer extends to a side face of the first intermediate layer and a side face of a tape-shaped metallic substrate in order to suppress the exfoliation of the first intermediate layer and the second intermediate layer.

Furthermore, JP-A No. 2004-31128 discloses a superconducting film-forming substrate in which an R face is shaped such that the R face spreads to the outside in a round shape (R shape) in an in-plane direction of a film-forming face, from an edge part of a rear side, that is the side opposite to the film-forming side, toward an edge part of the film-forming face, although this is not a countermeasure against exfoliation of an intermediate layer or a superconducting layer.

SUMMARY OF INVENTION

Technical Problem

In JP-A No. 2011-165568, however, the side face of the substrate for forming a superconducting film is perpendicular to the film-forming face, and consequently it is difficult to form a film on the side face. The state of layering on the side face after the film is formed also tends to become uneven over the lengthwise direction as compared with that on the film-forming face. Furthermore, adhesion at a corner portion located between the film-forming face and the side face tends to become weak as compared with other portions. As a result, intermediate layers including the first intermediate layer and the second intermediate layer or the superconducting layer may exfoliate.

Furthermore, in JP-A No. 2004-31128, an R face is not formed on the film-forming face although the R face is formed on the rear face. In other words, there is a corner portion between the film-forming face and the side face, and the intermediate layer or the superconducting layer may exfoliate with the corner portion as the starting point of the exfoliation.

The invention has been made in view of the facts described above. An object of the invention is to provide a superconducting film-forming substrate, with which it is possible to reliably form a superconducting layer on a side face and also to suppress exfoliation of the formed layer, and to provide a superconducting wire and a method of manufacturing a superconducting wire.

Solution to Problem

<1> A superconducting film-forming substrate having a tape shape, the substrate comprising: a film-forming face for forming a laminate including a superconducting layer thereon; a rear face that is a face at a side opposite to the film-forming face; a pair of end faces connected to the film-forming face and the rear face; and a pair of side faces connected to the film-forming face, the rear face, and the pair of end faces, wherein each of the pair of side faces comprises a spreading face that spreads toward an outer side in an in-plane direction of the film-forming face from an edge part of the film-forming face toward the rear face side.

<2> The superconducting film-forming substrate according to <1>, wherein a surface roughness of the spreading face is rougher than a surface roughness of the film-forming face.

<3> The superconducting film-forming substrate according to <2>, wherein the surface roughness of the spreading face is at least 15 nm.

<4> The superconducting film-forming substrate according to any one of <1> to <3>, wherein a ratio of a spreading distance in each of the pair of spreading faces in the in-plane direction of the film-forming face relative to a maximum distance between the pair of side faces is in a range of from 0.005% to 7.59%.

<5> The superconducting film-forming substrate according to any one of <1> to <4>, the substrate comprising: a tape-shaped substrate main body; and a metallic layer that covers at least both side faces of the substrate main body and that has a higher malleability than the substrate main body, wherein the pair of side faces are formed on the metallic layer.

<6> The superconducting film-forming substrate according to any one of <1> to <5>, wherein the pair of side faces comprises an anchor part that is a depression provided over a lengthwise direction of the superconducting film-forming substrate.

<7> The superconducting film-forming substrate according to any one of <1> to <6>, wherein: the spreading face that spreads from the edge part of the film-forming face is designated as a first spreading face, and the pair of side faces further comprises a second spreading face that spreads toward an outer side in the in-plane direction of the film-forming face from an edge part of the rear face toward the first spreading face.

<8> The superconducting film-forming substrate according to any one of <1> to <7>, wherein the pair of side faces comprises a perpendicular face that is connected to the spreading face and that is perpendicular to the rear face.

<9> A superconducting wire, comprising: the superconducting film-forming substrate according to any one of <1> to <8>; an intermediate layer disposed on the film-forming face of the superconducting film-forming substrate and on at least the spreading face on the pair of side faces; and a superconducting layer disposed on a surface of the intermediate layer.

<10> The superconducting wire according to <9>, wherein the superconducting layer comprises: a superconducting part located over the film-forming face and having, as a main component, an oxide superconductor that forms a superconducting phase; and a normal conducting part located over the spreading face and including an oxide superconductor that forms a normal conducting phase.

<11> The superconducting wire according to <9> or <10>, wherein the superconducting layer extends further toward an outer side in an in-plane direction of the spreading face than the intermediate layer and covers end faces of the intermediate layer.

<12> A superconducting wire manufacturing method, comprising: a working process of working a superconducting film-forming substrate having a tape shape, the substrate comprising a film-forming face for forming a laminate including a superconducting layer thereon, a rear face that is a face at a side opposite to the film-forming face, a pair of end faces connected to the film-forming face and the rear face, and a pair of side faces connected to the film-forming face and the rear face, so as to shape a spreading face that spreads toward an outer side in an in-plane direction of the film-forming face from an edge part of the film-forming face toward the rear face side, on each of the pair of side faces; an intermediate layer forming process of forming an intermediate layer on the film-forming face of the superconducting film-forming substrate and on at least the spreading face on the pair of side faces, after the working process; and a superconducting layer forming process of forming a superconducting layer on a surface of the intermediate layer.

<13> The superconducting wire manufacturing method according to <12>, wherein: the working process comprises a covering process of covering the pair of side faces of a tape-shaped substrate main body with a metallic layer that has a higher malleability than the substrate main body, to obtain the superconducting film-forming substrate, and the metallic layer of the obtained superconducting film-forming substrate is worked to shape a spreading face on each of the pair of side faces.

<14> The superconducting wire manufacturing method according to <12> or <13>, the method comprising a process of conducting a heat treatment on a superconducting layer part located over the spreading face to bring the superconducting layer part located over the spreading face into a non-superconducting state, after the superconducting layer forming process.

Advantageous Effects of Invention

According to the invention, it is possible to provide a superconducting film-forming substrate, with which it is possible to reliably form a superconducting layer on a side face and also to suppress exfoliation of the formed layer, and to provide a superconducting wire and a method of manufacturing a superconducting wire.

DESCRIPTION OF EMBODIMENTS

Figure 1:
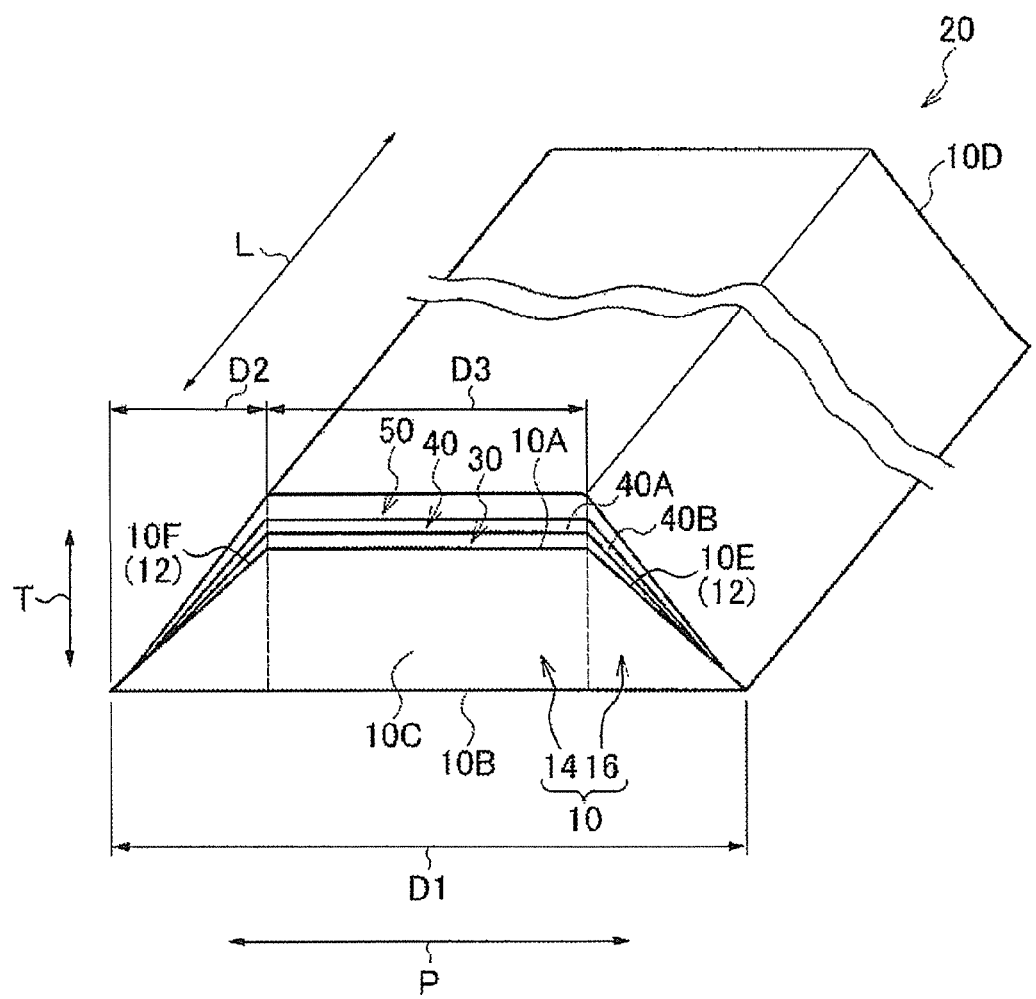
FIG. 1 is an oblique perspective view of a superconducting wire including a superconducting film forming substrate according to a first embodiment of the invention.

Hereafter, a superconducting film forming substrate, a superconducting wire, and a superconducting wire manufacturing method according to embodiments of the invention are described specifically with reference to the accompanying drawings. Members (components) having the same or corresponding functions are denoted by the same reference characters throughout the drawings, and description of them is omitted.

First Embodiment

Schematic Configuration of Superconducting Film Forming Substrate and Superconducting Wire FIG. 1 is an oblique perspective view of a superconducting wire including a superconducting film forming substrate according to a first embodiment of the invention.

As illustrated in FIG. 1, a superconducting wire 20 has a layered structure in which an intermediate layer 30, a superconducting layer 40, and a stabilizing layer 50 are disposed in layers in this order on a main face (hereafter referred to as film forming face 10A), that is at one side in a thickness direction T, of a superconducting film forming substrate 10.

The superconducting film forming substrate 10 has a tape shape extending in an L direction (hereafter referred to as lengthwise direction L) indicated by illustrated arrows. As this superconducting film forming substrate 10, a metallic substrate having low magnetism or a ceramics substrate is used. As a material of the metallic substrate, for example, a metal such as Co, Cu, Cr, Ni, Ti, Mo, Nb, Ta, W, Mn, Fe, or Ag, or any alloy thereof, which is excellent in strength and heat resistance, is used. Especially, from the viewpoint of excellent corrosion resistance and thermal resistance, it is preferable to use a Ni base alloy such as HASTELLOY (registered trademark) or INCONEL (registered trademark), or a Fe base alloy such as a stainless steel. Any of various ceramics may be disposed on such a metal material. As a material of the ceramics substrate, for example, MgO, $SrTiO_2$, or yttrium-stabilized zirconia is used.

The superconducting film forming substrate 10 has a rear face 10B which is a face at a side opposite to the film forming face 10A, and a pair of end faces 10C and 10D connected to the film forming face 10A and the rear face 10B, besides the film forming face 10A for forming a laminate including the superconducting layer 40 thereon.

The film forming face 10A is made to be a substantially smooth face. For example, it is preferable that the film forming face 10A has a surface roughness of 10 nm or less. Because the degree of orientation of a superconducting layer part 40A located over (deposited over) the film forming face 10A can be made high, and consequently superconducting characteristics of the superconducting wire 20 can be enhanced. It is more preferable that the surface roughness of the film forming face 10A is in the range of from 0.01 nm to 1 nm in order to make the degree of orientation of the superconducting layer 40 high and make a difference from a spreading face 12, which is described later, clear.

The surface roughness is an arithmetic average roughness Ra in "amplitude average parameters in the height direction" in surface roughness parameters prescribed in JISB-0601-2001.

The superconducting film forming substrate 10 has a pair of side faces 10E and 10F connected to the film forming face 10A, the rear face 10B, and the pair of end faces 10C and 10D.

Each of the pair of side faces 10E and 10F includes a spreading face 12 that spreads toward an outer side (which is hereafter referred to as an outer side in in-plane direction P and which coincides with an outer side of a width direction of the substrate) in an in-plane direction P of the film-forming face 10A (or a width direction of the substrate) from an edge part of the film-forming face 10A toward the rear face 10B.

Specifically, in the superconducting film forming substrate 10 according to a first embodiment of the invention, the spreading faces 12 indicate both of the pair of side faces 10E and 10F as illustrated in FIG. 1 and each of the spreading faces 12 is an inclined face having an interior angle with respect to the film forming face 10A of greater than 90 degrees and smaller than 180 degrees. As a result, each of the pair of end faces 10C and 10D has a shape of a trapezoid having the film forming face 10A as a upper base and the rear face 10B as a lower base.

It is preferable that the interior angle formed by the film forming face 10A and the spreading face 12 is at least 95 degrees from the viewpoint of easiness of forming, for example, the intermediate layer 30 over the spreading faces 12. Furthermore, it is preferable that the interior angle is in the range of from 110 to 145 degrees from the viewpoint of easiness of shaping at the pair of side faces 10 E and 10F.

It is preferable that the surface roughness of the spreading face 12 is rougher than the surface roughness of the film forming face 10A from the viewpoint that the degree of orientation of crystal of a superconducting layer part 40B located over (deposited over) the spreading face 12 is made lower than that of a superconducting layer part located over the film forming face 10A or crystals in the superconducting layer part 40B is made non-oriented and from the viewpoint that an anchor effect is generated. Specifically, it is preferable that the surface roughness of the spreading face 12 is at least 15 nm and the surface roughness of the film forming face 10A is 10 nm or less as described above. When the surface roughness of the spreading face 12 is less than 15 nm, crystals in the superconducting layer part 40B located over the spreading face 12 are oriented and the superconducting layer part 40B becomes superconductive, resulting in a start point of a current path or a cause of thermal instability. By making the surface roughness of the spreading face 12 to 15 nm or more, therefore, it is possible to make crystal growth of the superconducting layer part 40B located over the spreading face 12 irregular, whereby the superconducting layer part 40B can be made to be normal conducting. In other words, when the surface roughness of the spreading face 12 is 15 nm or more, it is possible to make the superconducting layer part 40B located over the spreading face 12 to be normal conducting and enhance a critical current value Ic.

Here, "to be normal conducting" means that if a superconductor is cooled to an extremely low temperature, occurrence of superconducting phenomenon is prevented.

It is more preferable that the surface roughness of the spreading face 12 is at least 20 nm from the viewpoint that a difference from the surface roughness of the film forming face 10A is made clear and continuity between the superconducting layer part 40B made to be normal conducting and the superconducting layer part 40A kept in the superconducting state and located over the film forming face 10A is partitioned.

It is preferable that the surface roughness of the spreading face 12 is 500 nm or less from the viewpoint that the film forming face 10A is prevented from being contaminated (subjected to indirect surface scratches) through scattering of remainder of abrasive grains for polishing at the time of manufacture or fine grains generated by contact of the spreading face 12 with a susceptor, a guide roll, or a guide pulley.

It is preferable to apply the surface roughness described heretofore not only to the spreading face 12 but also to the pair of side faces 10E and 10F including the spreading face 12.

It is preferable that a ratio of a spreading distance D2 of each of the pair of spreading faces 12 in the in-plane direction P of the film forming face 10A (which is a distance of the spreading face between an end on the film forming face side and an end on the rear face side in the in-plane direction P of the film forming face 10A and which is also referred to as shoulder distance) to a maximum distance D1 between the pair of side faces 10E and 10F (inclusive of a length of a width D3 of the film forming face 10A) represented by {(D2/D1)× 100} is in the range of from 0.005% to 7.59%. Because exfoliation characteristics (specifically, characteristics that exfoliation is hard to occur after film formation on the spreading faces 12) become favorable and superconducting characteristics (specifically critical current characteristics) also become favorable by adjusting the spreading distance D2 while securing the width D3 of the film forming face 10A. As for the exfoliation characteristics, specifically, when the ratio of the spreading distance D2 to the maximum distance D1 is in the above-described numerical value range, the total length of exfoliating parts can be suppressed more efficiently although plural exfoliating parts are observed in an evaluation sample length of 1 m.

Furthermore, it is preferable that the ratio of the spreading distance D2 to the maximum distance D1 is in the range of from 0.018% to 5.00%. Because when the ratio is in this range, the exfoliation can be efficiently suppressed in an evaluation sample of 1 m.

From the viewpoint of suppressing exfoliation more efficiently, it is preferable that the ratio of the spreading distance D2 to the maximum distance D1 is in the range of from 0.15% to 1.00%.

The superconducting film forming substrate 10 described heretofore may be formed of a single component and/or member, or may be formed of plural components and/or members.

For example, as illustrated in FIG. 1, the superconducting film forming substrate 10 may include a substrate main body 14 that has a tape shape, and has a rectangular-shaped sectional view when cut in the thickness direction, and that is formed of any of the materials described above as the materials used for the superconducting film forming substrate 10, in a central part of the superconducting film forming substrate 10, and a metallic layer 16 that covers at least both side faces of the substrate main body 14 and that has a higher malleability than the substrate main body 14.

As a result, the pair of side faces 10F and 10E is shaped on the metallic layer 16. Since the metallic layer 16 has a higher malleability than the substrate main body 14, the shaping is facilitated. Furthermore, as compared with a case where the malleability of the whole superconducting film forming substrate 10 increases, lowering of the mechanical strength of the superconducting film forming substrate 10 can be suppressed, by an amount of the substrate main body 14.

Examples of the material of the metallic layer 16 include metal which includes at least one selected from the group consisting of Ag, Cu, Ni, Cr, Mo, W, V, Au, Sn, Al and P. It is preferable that the metallic layer 16 has a malleability of at least 2% stretching from the viewpoint of easiness to shape.

In FIG. 1, the intermediate layer 30 is disposed on the film forming face 10A and the spreading face 12 of the superconducting film forming substrate 10. The intermediate layer 30 is a layer, for example, for implementing high biaxial orientation in the superconducting layer 40. In the intermediate layer 30, for example, physical characteristic values such as a rate of thermal expansion and a lattice constant exhibit intermediate values between those of the superconducting film forming substrate 10 and those of a superconductor that is a component of the superconducting layer 40. The intermediate layer 30 may have a single layer structure, or may have a multilayer structure. When the intermediate layer 30 has a multilayer structure, the number of layers and kinds are not limited. When the intermediate layer 30 has a multilayer structure, the intermediate layer 30 may have a configuration in which a bed layer including, for example, amorphous $Gd_2Zr_2O_{7-\delta}$ ($\delta$ is an oxygen non-stoichiometric amount), a forcibly oriented layer which includes, for example, crystalline MgO and which is shaped by using the Ion Beam Assisted Deposition (IBAD) method, an LMO layer including $LaMnO_{3+\delta}$ ($\delta$ is an oxygen non-stoichiometric amount), and a cap layer including, for example, $CeO_2$, are disposed in layers in this order.

The superconducting layer 40 is disposed on a surface of the intermediate layer 30. It is preferable that the superconducting layer 40 contains an oxide superconductor, especially a copper oxide superconductor. As the copper oxide superconductor, $REBa_2Cu_3O_{7-\delta}$ functioning as a high temperature superconductor (hereafter referred to as RE system superconductor) is preferable. By the way, RE in the RE system superconductor is a single rare-earth element or plural rare-earth elements, such as Y, Nd, Sm, Eu, Gd, Dy, Ho, Er, Tm, Yb, or Lu. Among them, RE is preferably Y, by a reason, for example, that replacement with a Ba site is hard to occur. $\delta$ is an oxygen non-stoichiometric amount. For example, $\delta$ is from 0 to 1. From the viewpoint that the superconductivity transition temperature is high, it is preferable that $\delta$ is close to 0. If, for example, high pressure oxygen annealing is performed by using a device such as an autoclave, the oxygen non-stoichiometric amount may be a value less than 0, i.e., a negative value sometimes.

As for the superconducting layer 40, it is preferable that the superconducting layer part 40A over the film forming face 10A becomes a superconducting part having, as a main component, the above-described oxide superconductor that forms a superconducting phase and the superconducting layer part 40B over the spreading face 12 becomes a normal conducting part including an oxide superconductor that forms a normal conducting phase. Because it is possible to suppress phenomenon in which the superconducting layer part 40B becomes a start point of an unnecessary current path or a start point of a thermal instability cause in a case where the superconducting layer part 40B is a normal conducting part.

Since the superconducting layer part 40B is previously shaped to have surface roughness in the range of from 15 nm to 500 nm, crystalline orientation of respective layers included in the intermediate layer 30 become uneven and consequently the orientation of the intermediate layer 30 varies. When the intermediate layer 30 includes a forcibly oriented layer shaped by the IBAD method, the irradiation direction in the IBAD method is adjusted at an arbitrary angle to properly irradiate the film forming face 10A of the superconducting film forming substrate 10, and consequently an irradiation angle for the pair of side faces 10E and 10F deviates from a proper angle for film forming, resulting in uneven film forming state of the intermediate layer 30. Because of the mechanism described heretofore, the superconducting layer part 40A located over the film forming face 10A and the superconducting layer part 40B located over the spreading face 12 are controlled to have different properties (a superconducting part and a normal conducting part).

Here, "main component" described above and in the following description represents a component contained the most among components contained in a layer or a part. For example, a layer or a part may be composed of only the main component.

An oxide superconductor that forms a normal conducting phase necessarily has a lower degree of orientation of crystal than an oxide superconductor that forms a superconducting phase.

It is preferable that the normal conducting part includes a part of at least one of compositions of the superconducting film forming substrate 10 or compositions of the intermediate layer 30. Because mixing the above-described composition into the oxide superconductor certainly brings the oxide superconductor into the normal conducting phase and enhances the adhesion between the superconducting layer 40 and the intermediate layer 30.

It is preferable that the superconducting layer 40 extends further toward the outer side in the in-plane direction of the spreading faces 10E and 10F than the intermediate layer 30 and covers end faces (tips in FIG. 1) of the intermediate layer 30 as illustrated in FIG. 1. As a result, exfoliation of the intermediate layer 30 can be further prevented. When the intermediate layer 30 has a multilayer structure, it is preferable that an intermediate layer on the superconducting layer 40 side covers end faces of an intermediate layer on the superconducting film forming substrate 10 side, in the same way as the superconducting layer 40.

The stabilizing layer 50 covers a surface of the superconducting layer 40. It is preferable that the stabilizing layer 50 covers end faces (tips in FIG. 1) of the superconducting layer 40 in the same way as the superconducting layer 40. It is more preferable that the stabilizing layer 50 covers the whole of circumference of the superconducting film forming substrate 10, the intermediate layer 30, and the superconducting layer 40.

The stabilizing layer 50 may have a single layer structure, or may have a multilayer structure. When the stabilizing layer 50 has a multilayer structure, the number of layers and kinds are not limited. When the stabilizing layer 50 has a multilayer structure, the stabilizing layer 50 may have a structure in which a silver stabilizing layer including silver and a copper stabilizing layer including copper are disposed in layers in this order.

The laminate (the intermediate layer 30, the superconducting layer 40, and the stabilizing layer 50) disposed over the spreading face 12 in the embodiment described above is disposed along inclination of the spreading face 12, and there is no gap between the spreading face and the laminate.

—Method for Manufacturing Superconducting Wire—

Figure 2:
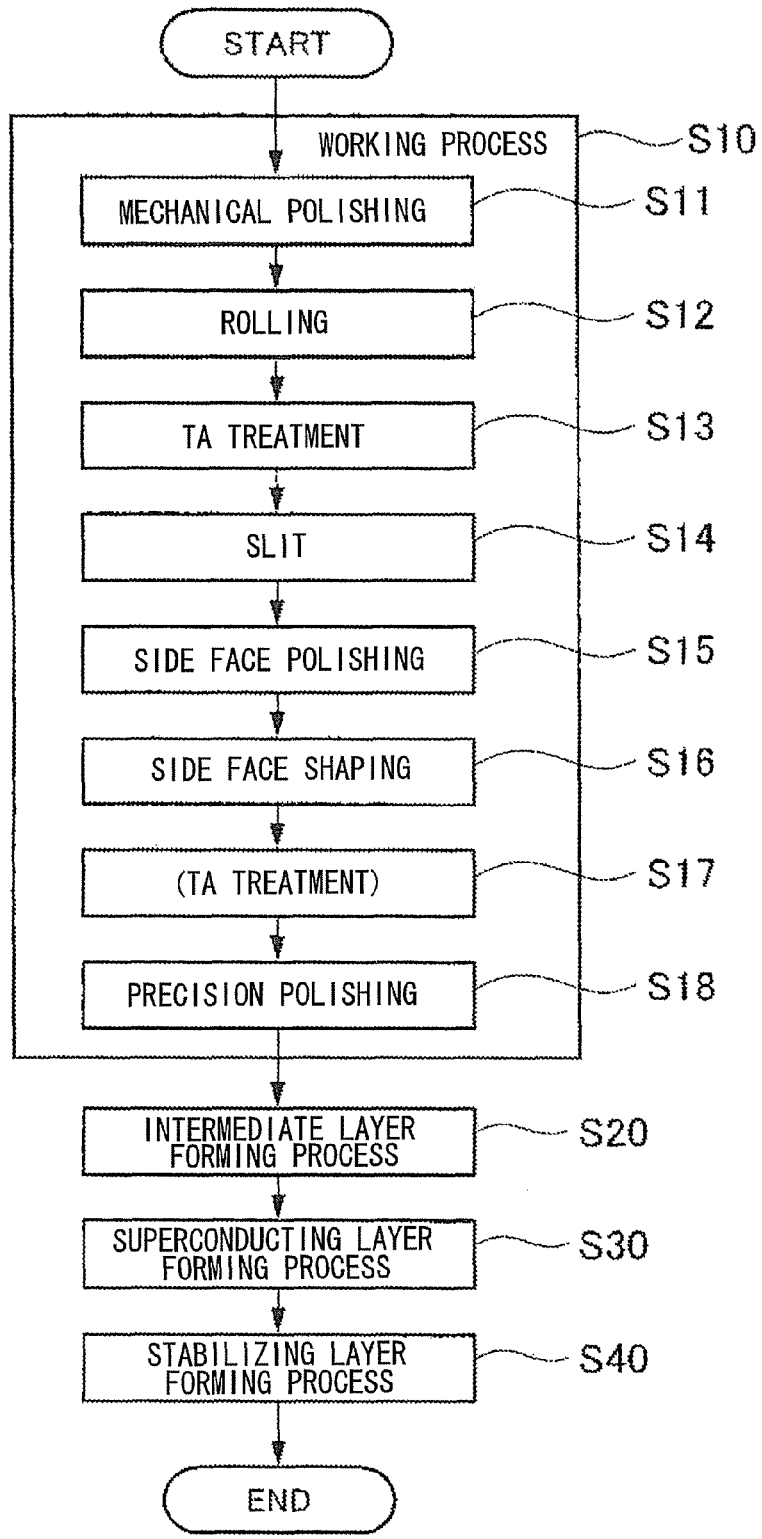
FIG. 2 is a process diagram of a superconducting wire manufacturing method according to a first embodiment of the invention.

A method for manufacturing the superconducting wire 20 according to the first embodiment of the invention is described. FIG. 2 is a process diagram of a method for manufacturing the superconducting wire 20 according to the first embodiment of the invention. Each of symbols in parentheses in the following is an illustrated step identification code.

(S10) First, a working process of working a superconducting film forming substrate having a tape shape, having a rectangular-shaped sectional view when cut in the thickness direction, and having the film forming face 10A for forming a laminate including the superconducting layer 40 thereon, the rear face 10B that is a face at a side opposite to the film forming face 10A, a pair of end faces 10C and 10D connected to the film forming face 10A and the rear face 10B, and a pair of side faces 10F and 10E connected to the film forming face 10A and the rear face 10B is performed.

This working process includes processes of step S11 to step S18. In a case where at least a side face shaping process at step S16 is performed, other processes can be omitted.

Hereafter, each detailed process in the working process is enumerated.

(S11) The surface roughness of the film forming face 10A and the rear face 10B of the superconducting film forming substrate is modified by machine polishing.

(S12) Then, the superconducting film forming substrate is rolled by a rolling machine.

(S13) Then, tension annealing treatment (TA treatment) is performed in order to further improve flatness of the superconducting film forming substrate.

(S14) Then, rolling is performed on the superconducting film forming substrate. In addition, a super conducting film forming substrate having a predetermined thickness and a predetermined width is obtained by conducting slit working at a finish size.

(S15) Then, a pair of side faces and corner parts on the film forming face side of the superconducting film-forming substrate are polished. As a result, it is possible to remove cutting traces, sharing traces, and fusion traces which may be dotted on the pair of side faces of the superconducting film forming substrate. As the polishing method, mechanical polishing, electrolytic polishing, chemical polishing, or a polishing method in which any of the above methods are combined can be used.

Abrasive grains used in the mechanical polishing are preferably, for example, diamond grains or oxide grains, especially aluminum oxide, cerium oxide, zirconium oxide, or iron oxide. A polishing liquid may be water, a surfactant, oil, an organic solvent, a mixture of them, a solution obtained by mixing an acid such as formic acid, acetic acid or nitric acid into water, or a solution obtained by mixing an alkali such as sodium hydroxide into water. Especially, soapy water is desirable. Whetstone polishing may be used. At this time, polishing shaping to obtain the shape of a side face roughly approximated to a final shape is also possible.

In chemical polishing, a polishing liquid is a chemical solvent which chemically reacts with the superconducting film forming substrate surface. For example, the polishing liquid is preferably a liquid of, for example, nitric acid, sulfuric acid, formic acid, acetic acid, chlorine, fluorine, chromic acid, hydrogen peroxide, oxalic acid, tetraphosphoric acid, glacial acetic acid, or a liquid of any mixture of them. The polishing liquid is also preferably a solution obtained by mixing an accelerator such as saturated alcohol or sulfonic acid into the mixture liquid is desirable.

In chemical mechanical polishing, the abrasive grains may be the above-described mechanical abrasive grains. A polishing solvent (slurry) including a solution of chemical polishing is used there.

In electrolytic polishing, the superconducting film forming substrate is immersed in an electrolytic liquid. A current is carried by using the superconducting film forming substrate as an anode. The surface of the superconducting film forming substrate is polished by an electrolytic reaction. This electrolytic liquid may be an acid or an alkali. Especially, for example, nitric acid, phosphoric acid, chromic acid, hydrogen peroxide, potassium hydroxide, or potassium cyanide is desirable.

(S16) On each of the pair of side faces 10F and 10E of the superconducting film forming substrate, the spreading face 12 which spreads toward the outer side in the in-plane direction P of the film forming face 10A from an edge part of the film forming face 10A toward the rear face 10B side is shaped. In this shaping, the side faces and the corner parts on the film forming face side can be provided with predetermined shapes by using combined rolls including a shaping roll and a flat roll. The shaping roll is used to shape the side face and the corner part on the film forming face side. The flat roll is used to shape uneven shapes near the corner of a wide width face (film forming face) changed in shape by the shaping roll.

The shaping roll is a groove type, and the shaping roll may have a united structure or may have a divided structure. It is also possible to shape the spreading face 12 to a predetermined shape with plural pairs of a shaping roll and a flat roll in which the plural pairs are combined in tandem.

Alternatively, a covering process may be provided before shaping to previously obtain a superconducting film forming substrate by covering a pair of side faces of a superconducting face forming substrate (which is a substrate main body 14 here) with a metallic layer 16 which has a higher malleability than the substrate main body. The metallic layer 16 of the thus obtained superconducting film forming substrate may be worked to shape a spreading face 12 on each of the pair of side faces of the superconducting film forming substrate.

In the covering process, a dry plating method or a wet plating method can be used.

A combination of shaping the side faces and the corner parts on the film forming face side of the superconducting film forming substrate to become a shape approximated to a final shape by polishing, then covering the side faces and the corner parts with the metallic layers 16, and conducting shaping to a final shape is also possible.

Furthermore, it is also possible to perform the above-described steps S15 and S16 simultaneously on a continuous line, which is effective in cost reduction.

(S17) The linearity of the substrate in which the side face shape thereof has been shaped by the shaping roll and the flat roll may change sometimes. At this time, the TA treatment is performed again in order to restore the flatness of the substrate. The conditions for this TA are determined according to required flatness of the superconducting film-forming substrate.

(S18) Then, the surface on the film-forming face side is polished with precision polishing. This precision polishing may be performed by using any method of electrolytic polishing, mechanical polishing, or chemical polishing.

There are no projections on the side faces and corner parts before the precision polishing, and the inclination is smooth. As a result, damage to the polishing line and polishing cloth and electric field concentration are reduced, and uniformity of polishing is improved. An effect of reducing the precision polishing cost is obtained.

The superconducting film-forming substrate 10 according to the first embodiment is obtained by conducting the working processes of S11 to S18 described heretofore. Among the above described S11 to S18, the processes other than S16 can be omitted.

(S20) Then, an intermediate layer forming process of forming the intermediate layer 30 on the film-forming face 10A side of the superconducting film-forming substrate 10 is performed.

In this intermediate layer forming process, the intermediate layer 30 is formed not only on the film-forming face 10A, which is formed by precision polishing and which has high flatness, of the superconducting film-forming substrate 10, but also on the pair of side faces 10E and 10F. At this time, the spreading face 12, which spreads toward the outer side in the in-plane direction P of the film-forming face 10A from the edge part of the film-forming part 10A to the rear face 10B side, has already been shaped. As a result, it is possible to reliably form the intermediate layer 30 on each of the pair of side faces 10E and 10F as well.

Examples of the film forming method for the intermediate layer 30 include a sputtering method and an IBAD method.

(S30) Then, a superconducting layer forming process of forming a film of the superconducting layer 40 on the surface of the intermediate layer 30 is performed. At this time, the spreading face 12, which spreads to the outside in the in-plane direction P of the film-forming face 10A as the location advances from the edge part of the film-forming part 10A to the rear face 10B side, is already shaped. As a result, the superconducting layer 40 can be positively formed as a film on each of the pair of side faces 10E and 10F as well.

Examples of the forming (forming a film) method for the superconducting layer 40 include a TFA-MOD method, a PLD method, a CVD method, a MOCVD method, or a sputtering method. For example, in the sputtering method, the superconducting layer 40 can be formed so as to cover corner parts (end parts) of the intermediate layer 30 by applying target particles in a range wider than the width of the intermediate layer 30 from a normal line direction of the surface of the intermediate layer 30 and depositing the target particles. It is also possible to further reliably form the superconducting layer 40 on the end faces of the intermediate layer 30 by conducting adjustment to a position where the application angle with respect to the surface of the intermediate layer 30 is increased or decreases in the width direction about the normal line direction.

At this time, it is preferable to perform a heat treatment locally on the superconducting layer part 40B formed over the spreading face 12, using, for example, irradiation with a laser beam or partial annealing and perform forcibly diffusion between layers and the superconducting film-forming substrate. Because the superconducting layer part 40B can be made non-superconductive, i.e., can be made to be normal conducting, and the adhesion between the superconducting layer 40B and the intermediate layer 30 is increased and consequently exfoliation can be further suppressed.

(S40) Then, a stabilizing layer forming process of forming the stabilizing layer 50 on the surface of at least the superconducting layer 40 is performed. As a method for forming (forming a film of) the stabilizing layer 50, for example, the sputtering method can be used.

In this sputtering method, target particles can be applied from a normal line direction of the surface of the superconducting layer 40 and deposited in a range wider than the width of the superconducting layer 40, and adjustment to a position where the angle is increased or decreased in the width direction can be performed, in the same way as the formation of the superconducting layer 40.

By the processes described above, the superconducting wire 20 according to the first embodiment of the invention can be obtained.

This superconducting wire 20 has the intermediate layer 30 and the superconducting layer 40 (laminate) not only over the film-forming face 10A but also over the spreading face 12. As compared with a superconducting wire having the laminate only over the film-forming face 10A, therefore, exfoliation of the laminate can be suppressed.

Second Embodiment

Figure 3:
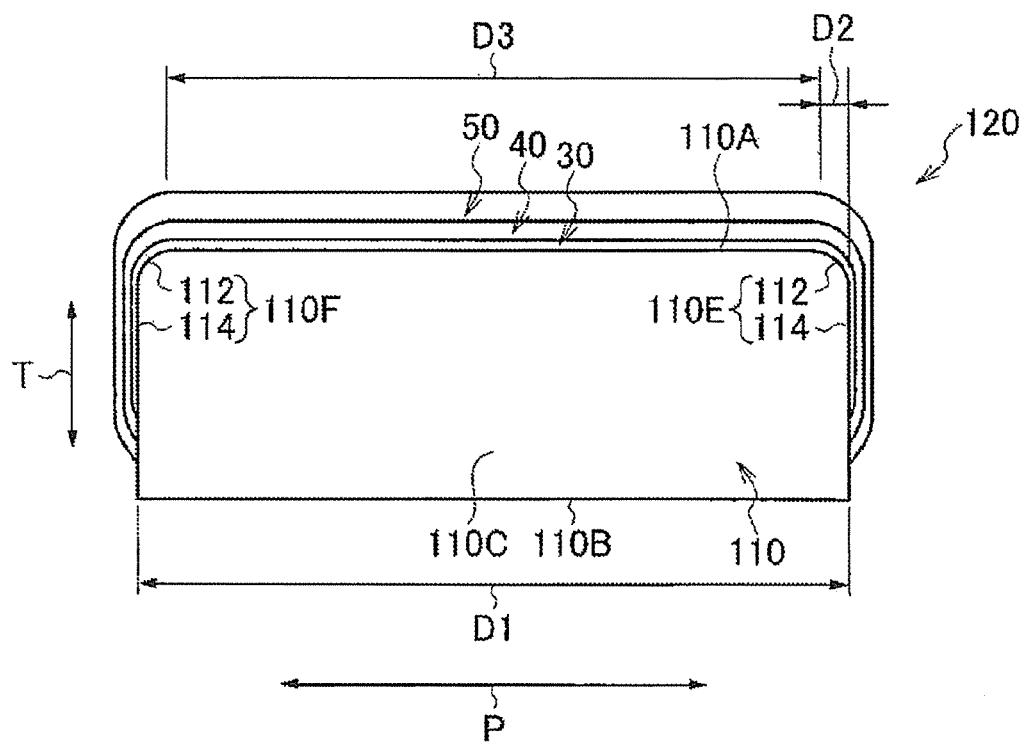
FIG. 3 is a view of a superconducting wire according to a second embodiment of the invention seen from an end face direction.

A superconducting wire according to a second embodiment of the invention is described. FIG. 3 is a view of a superconducting wire 120 according to the second embodiment of the invention seen from an end face direction.

The superconducting wire 120 has a layered structure in which an intermediate layer 30, a superconducting layer 40, and a stabilizing layer 50 are disposed in layers in this order on a film-forming face 110A of a superconducting film-forming substrate 110.

The superconducting film-forming substrate 110 includes a rear face 110B which is a face at a side opposite to the film-forming face 110A, a pair of end faces (only one end face 110C is illustrated) connected to the film-forming face 110A and the rear face 110B, and a pair of side faces 110E and 110F connected to the film-forming face 110A, the rear face 110B, and the pair of end faces (only one end face 110C is illustrated), besides the film-forming face 110A for forming a laminate including the superconducting layer 40 thereon.

Each of the pair of side faces 110E and 110F includes a spreading face 112, which spreads toward an outer side in an in-plane direction P of the film-forming face 110A (or a width direction of the substrate) from an edge part of the film-forming face 110A toward the rear face 110B side, and an orthogonal face 114 that is perpendicular to the rear face 110B and is connected to the spreading face 112.

In the second embodiment, the spreading face 112 indicates an R shape edge part on the film-forming face side of each of the pair of side faces 110E and 110F.

The spreading face 112 can be constituted in the same way as the spreading face 12.

For example, it is preferable that a ratio of a spreading distance D2 of each of the pair of spreading faces 112 in the in-plane direction P of the film-forming face A (which is a distance of each of the spreading faces between an end on the film-forming face side and an end on the rear face side in the in-plane direction P of the film-forming face) to a maximum distance D1 between the pair of side faces 110E and 110F (inclusive of a length of a width D3 of the film-forming face 110A) represented by $\{(D2/D1) \times 100\}$ is in the range of from 0.005% to 7.59%. Furthermore, it is preferable that the ratio of the spreading distance D2 to the maximum distance D1 is in the range of from 0.018% to 5.00%. It is preferable that the ratio of the spreading distance D2 to the maximum distance D1 is in the range of from 0.15% to 1.00%.

Since other details of each configuration is similar to those in the first embodiment, description of them is omitted.

According to the superconducting film-forming substrate 110 in the second embodiment heretofore described, the spreading face 112 having an R shape is provided. As a result, it is possible to reliably form the intermediate layer 30 and the superconducting layer 40 over the pair of side faces 110E and 110F as well, and it is possible to prevent exfoliation of the intermediate layer 30 and the superconducting layer 40.

Furthermore, since the superconducting film-forming substrate 110 includes the orthogonal face 114, it is possible to reduce the total width of the superconducting film-forming substrate 110 while maintaining the film-forming face 110A, as compared with the first embodiment.

In the second embodiment, the laminate including the intermediate layer 3 may be disposed not only over the spreading face 112 but also over the orthogonal face 114.

Third Embodiment

Figure 4:
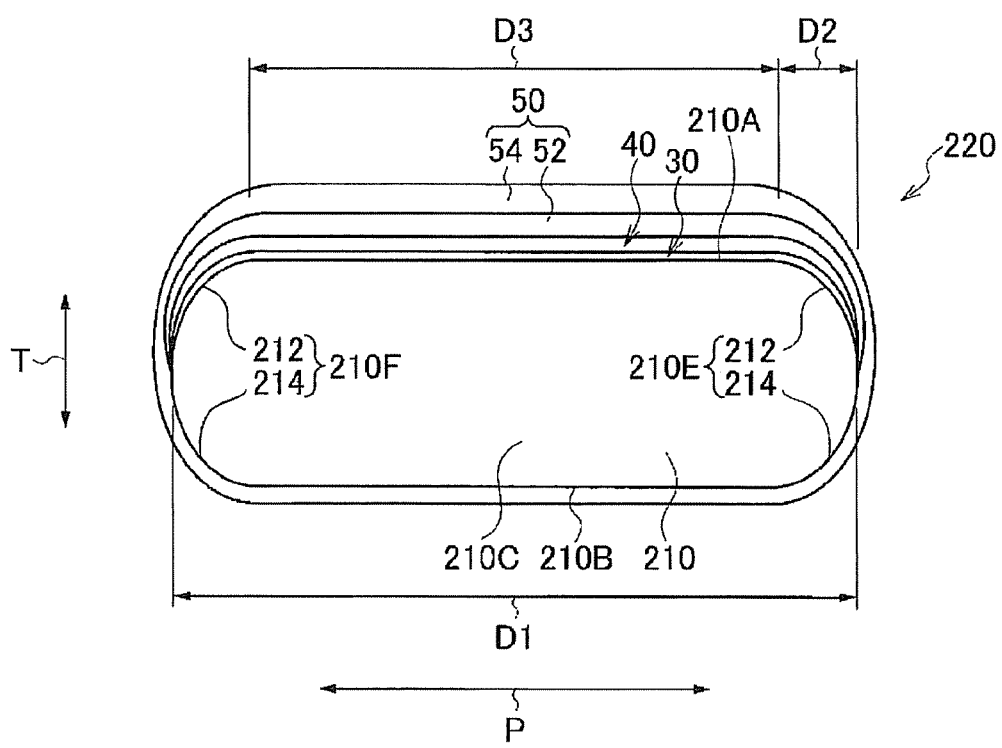
FIG. 4 is a view of a superconducting wire according to a third embodiment of the invention seen from an end face direction.

A superconducting wire according to a third embodiment of the invention is described. FIG. 4 is a view of a superconducting wire 220 according to the third embodiment of the invention seen from an end face direction.

The superconducting wire 220 has a laminate structure in which an intermediate layer 30, a superconducting layer 40, and a two-layer stabilizing layer 50 (a first layer is a first stabilizing layer 52 and a second layer is a second stabilizing layer 54) are disposed in layers in this order on a film-forming face 210A of a superconducting film-forming substrate 210. In the third embodiment, the first stabilizing layer 52 covers a part of a circumference of the superconducting film-forming substrate 210 whereas the second stabilizing layer 54 covers the whole circumference of the superconducting film-forming substrate 210. However, both the first stabilizing layer 52 and the second stabilizing layer 54 may cover the whole circumference of the superconducting film-forming substrate 210.

The superconducting film-forming substrate 210 has, besides the film-forming face 210A for forming a laminate including the superconducting layer 40 thereon, a rear face 210B which is a face at a side opposite to the film-forming face 210A, a pair of end faces (only one end face 210C is illustrated) connected to the film-forming face 210A and the rear face 210B, and a pair of side faces 210E and 210F connected to the film-forming face 210A, the rear face 210B, and the pair of end faces 210C.

Each of the pair of side faces 210E and 210F includes a first spreading face 212, which spreads toward an outer side in an in-plane direction P of the film-forming face 210A (or a width direction of the substrate) from an edge part of the film-forming face 210A toward the rear face 210B side, and a second spreading face 214, which spreads toward the outer side of the rear face 210B in the in-plane direction P of the film-forming face 210A from an edge part of the rear face 210B toward the first spreading face 212 side.

In the third embodiment, both the first spreading face 212 and the second spreading face 214 has an R shape and are connected to each other. In other words, each of the pair of side faces 210E and 210F has the shape of a circular arc The first spreading face 212 and the second spreading face 214 can be constituted in the same way as the spreading face 12.

For example, it is preferable that a ratio of a spreading distance D2 of each of the pair of first spreading faces 212 in the in-plane direction P of the film-forming face (which is a distance of the first spreading face between an end on the film-forming face side and an end on the rear face side in the in-plane direction P of the film-forming face) to a maximum distance D1 between the pair of side faces 210E and 210F represented by $\{(D2/D1)\times 100\}$ is in the range of from 0.005% to 7.59%. Furthermore, it is preferable that the ratio of the spreading distance D2 to the maximum distance D1 is in the range of from 0.018% to 5.00%. Iis preferable that the ratio of the spreading distance D2 to the maximum distance D1 is in the range of from 0.15% to 1.00%.

Since other details of each configuration is similar to those in the first embodiment, description of them is omitted.

According to the superconducting film-forming substrate 210 in the third embodiment, the first spreading face 212 having an R shape is provided. As a result, it is possible to reliably form the intermediate layer 30 and the superconducting layer 40 over the pair of side faces 210E and 210F as well. Accordingly, it is possible to suppress exfoliation of the intermediate layer 30 and the superconducting layer 40.

Furthermore, the second spreading face 214 taking the R shape is provided. As a result, it is possible to reliably form the second stabilizing layer 54 covering the whole circumference of the superconducting film-forming substrate 210 with respect to vicinities of edge parts of the rear face 210B.

Modifications

The invention is described in detail with reference to specific embodiments in the above. However, the invention is not limited to such embodiments. It is apparent to those skilled in the art that other various embodiments are possible in the scope of the invention. For example, the above-described plural embodiments can be combined suitably and implemented. Furthermore, the following modifications may be combined as appropriate.

For example, shapes of a pair of side faces of the superconducting film-forming substrate are not especially limited as long as a spreading face is included. The pair of side faces may have shapes as illustrated in FIGS. 5A to 5D.

Figure 5A:
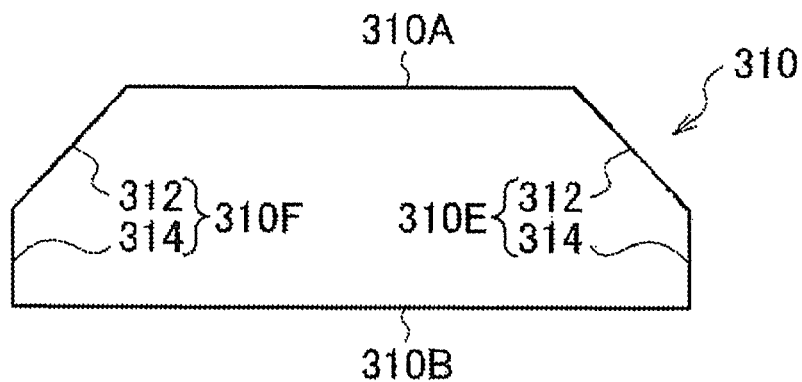
FIG. 5A is a diagram illustrating a modification example of shapes of a pair of side faces of a superconducting film forming substrate.

A superconducting film-forming substrate 310 illustrated in FIG. 5A has a film-forming face 310A, a rear face 310B, and a pair of side faces 310E and 310F. Each of the pair of side faces 310E and 310F includes a spreading face 312 inclined toward an outer side in an in-plane direction of the film-forming face (or a width direction of the substrate) from an edge part of the film-forming face 310A toward the rear face 310B side, and an orthogonal face 314 connected to the spreading face 312 and the rear face 310B and perpendicular to the rear face 310B.

Figure 5B:
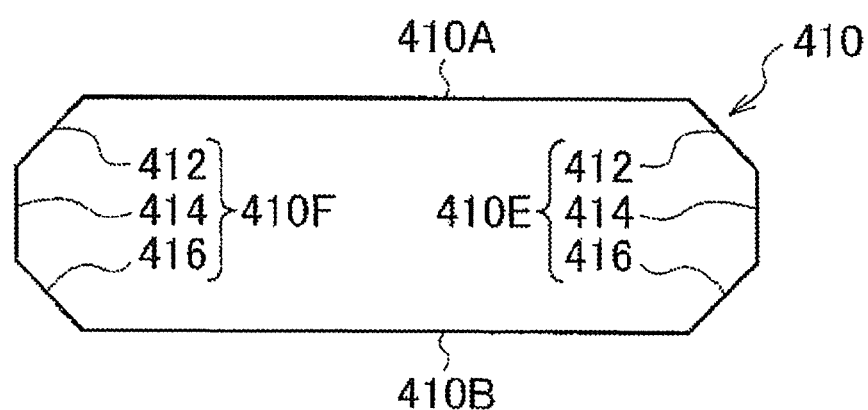
FIG. 5B is a diagram illustrating a modification of shapes of one pair of side faces of a superconducting film forming substrate.

A superconducting film-forming substrate 410 illustrated in FIG. 5B has a film-forming face 410A, a rear face 410B, and a pair of side faces 410E and 410F. Each of the pair of side faces 410E and 410F includes a first spreading face 412 inclined toward an outer side in an in-plane direction of the film-forming face 410A (or a width direction of the substrate) from the film-forming face 410A toward the rear face 410B side, a perpendicular face 414 connected to the first spreading face 412 and perpendicular to the rear face 410B, and a second spreading face 416 connected to the perpendicular face 414 and the rear face 410B and inclined toward the outer side in the in-plane direction of the film-forming face 410A from the rear face 410B toward the film-forming face 410A side.

Figure 5C:
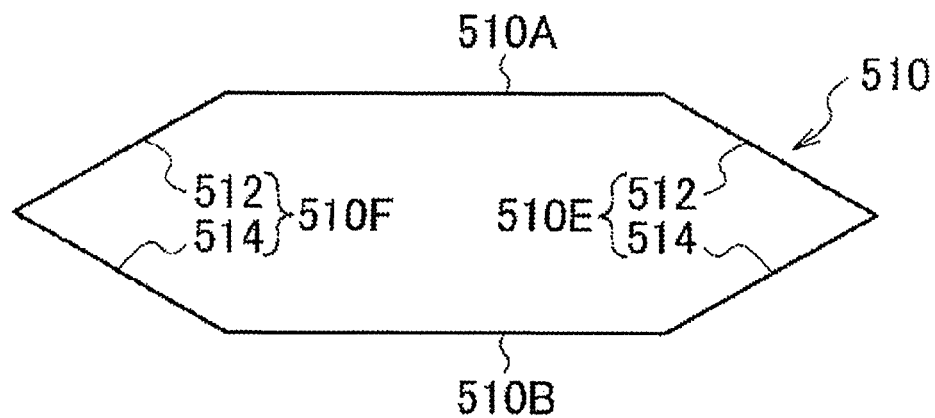
FIG. 5C is a diagram illustrating a modification example of shapes of a pair of side faces of a superconducting film forming substrate.

A superconducting film-forming substrate 510 illustrated in FIG. 5C has a film-forming face 510A, a rear face 510B, and a pair of side faces 510E and 510F. Each of the pair of side faces 510E and 510F includes a first spreading face 512 inclined toward an outer side in an in-plane direction of the film-forming face 510A (or a width direction of the substrate) from an edge part of the film-forming face 510A toward the rear face 510B side, and a second spreading face 514 connected to the first spreading face 512 and the rear face 510B and inclined toward the outer side in the in-plane direction of the film-forming face 510A from an edge part of the rear face 510B toward the film-forming face 510A side.

Figure 5D:
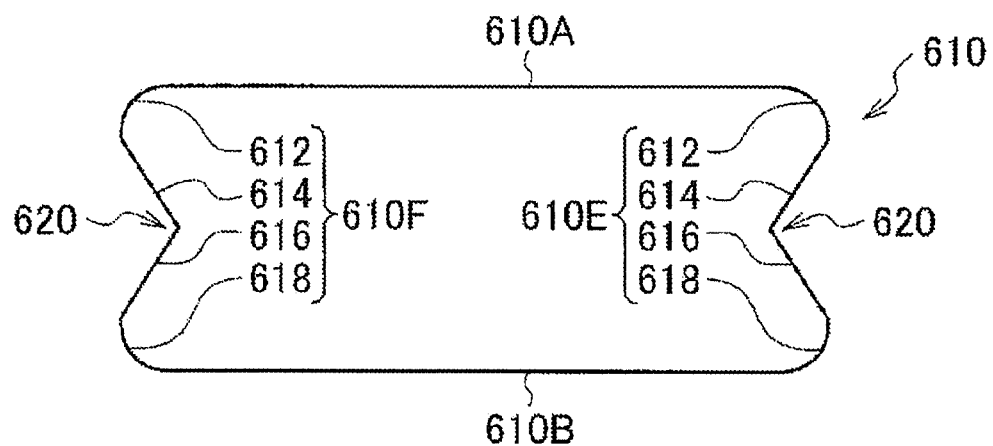
FIG. 5D is a diagram illustrating a modification example of shapes of a pair of side faces of a superconducting film forming substrate.

A superconducting film-forming substrate 610 illustrated in FIG. 5D has a film-forming face 610A, a rear face 610B, and a pair of side faces 610E and 610F. Each of the pair of side faces 610E and 610F includes a first spreading face 612 which spreads in an R shape from the film-forming face 610A, an inclined face 614 connected to the first spreading face 612 and inclined toward inside in an in-plane direction of the film-forming face 610A (or a width direction of the substrate), an inclined face 616 connected to the inclined face 614 and inclined to outside in the in-plane direction of the film-forming face 610A (or a width direction of the substrate), and a second spreading face 618 connected to the inclined face 616 and the rear face 610B and spreading in an R shape from the rear face 610B.

On each of the pair of side faces 610E and 610F, an anchor part 620 is formed in a central part of the side face over the lengthwise direction L (see FIG. 1) by the inclined face 614 and the inclined face 616. By disposing a laminate including the superconducting layer 40 on the anchor part 620, it becomes possible to further suppress exfoliation of the laminate.

Figure 6A:
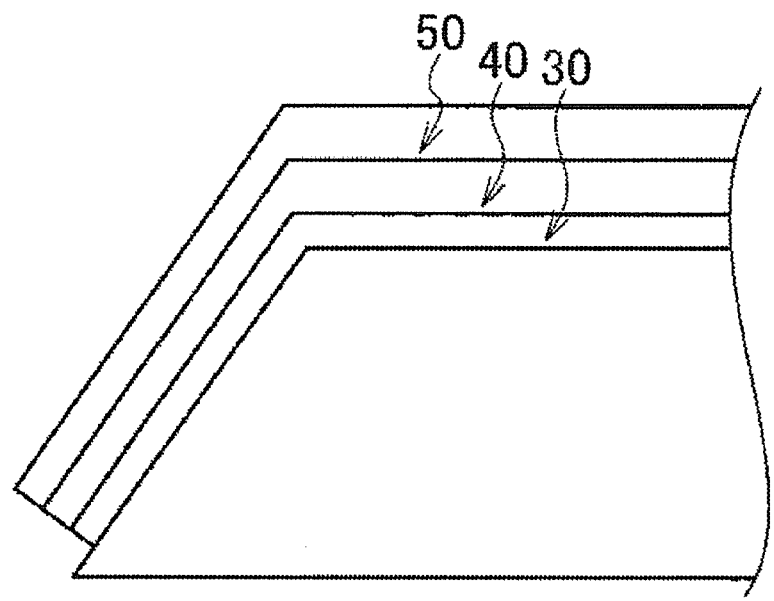
FIG. 6A is a diagram illustrating a modification example of a layered structure of a laminate including a superconducting layer.
Figure 6B:
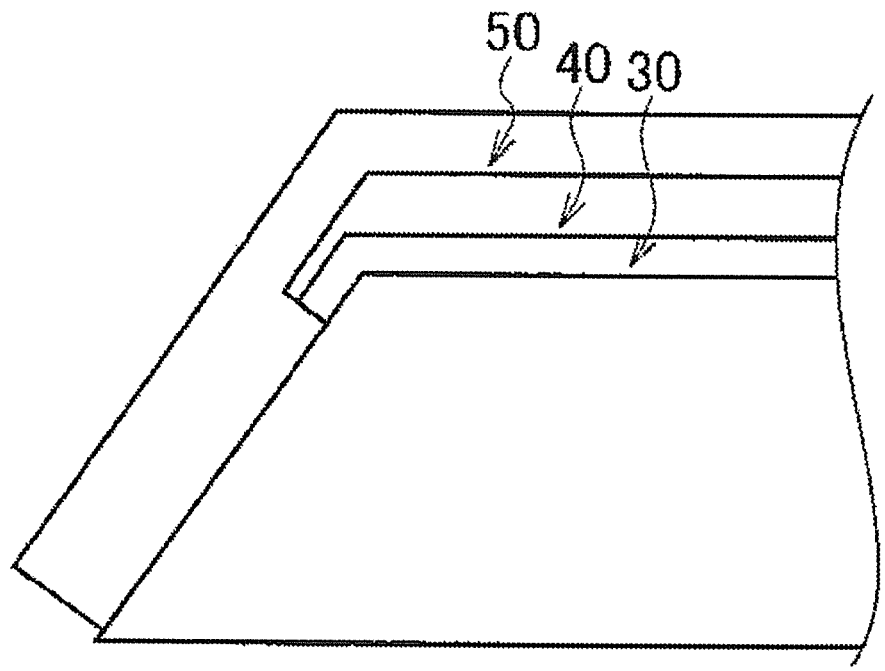
FIG. 6B is a diagram illustrating a modification example of a layered structure of a laminate including a superconducting layer.

Although the laminate including the superconducting layer 40 is configured to cover as far as the end face of a lower layer, as illustrated in FIG. 6A, the laminate may be configured not to cover as far as the end face of a lower layer. As illustrated in FIG. 6B, only the stabilizing layer 50 may cover as far as the end face of the superconducting layer 40 and the intermediate layer 30.

In the embodiments, cases where the superconducting wire 20, 120 or 220 includes the intermediate layer 30 and the stabilizing layer 50 have been described. However, the intermediate layer 30 and the stabilizing layer 50 may be omitted.

EXAMPLE

Hereafter, a superconducting film-forming substrate, a superconducting wire, and a superconducting wire manufacturing method according to the invention are described with reference to examples. However, the invention is not limited at all by these examples.

Example 1

A superconducting film-forming substrate and a superconducting wire according to example 1 were fabricated as described hereafter.

First, a surface roughness Ra of both faces of a HASTELLOY material of 0.3 mmt×75 mm width×350 m (BA (bright annealing) material: surface roughness of approximately Ra 50 nm) was modified to approximately 30 nm by machine polishing.

Then, a tape substrate of 0.1 mmt×75 mm width×1050 m was manufactured by using this tape substrate and a 12-stage rolling machine having a roll diameter Φ of 20 mm.

The surface roughness Ra of the surface and the rear face of a final finish tape substrate in rolling at this time was made approximately 9 nm by mirror finish.

Then, in order to improve the flatness of the tape substrate, a tension of 6 kgf/mm$^2$ is applied to the tape substrate under a holding condition of 790° C. for 20 seconds, and a heat treatment was performed in an atmosphere of a mixed gas of argon gas and hydrogen (tension annealing (TA) treatment).

Six strips of tape of thickness 100 μm and width 10 mm×1050 m were obtained by conducting rolling on the tape substrate in this way and by conducting slit working with a finish size. The working ratio in the rolling process of at least 60% was secured.

Slitting at this time was performed in such a manner that slit faces have a unified direction to cause the surface at the time of rolling to become all surfaces of six strips of 10 mm width after the slitting. In this case, the output side direction of burrs generated by the slitting can be unified to the rear face direction of 10 mm width. Therefore, the shape controllability of the side face is high, and it is significant. Even if a slitting method in which burrs are output in alternate directions is used, side face shaping is possible. However, work such as inverting the top and rear faces may become complicated sometimes.

Then, side faces and corner parts of the superconducting film-forming substrate obtained by slitting were polished by mechanical polishing to remove cutting traces, sharing traces, and fusion traces which are dotted on the pair of side faces and corner parts. The Ra of the side faces is finished to approximately 50 nm. Polishing was performed by using a (No. 600) grindstone.

Then, shaping of a pair of side faces was performed by using combined rolls including one set of shaping rolls and one set of vertical flat rolls to cause each of pair of side faces of the superconducting film-forming substrate to include a spreading face which spreads toward the outer side in the in-plane direction of the film-forming face from an edge part of the film-forming face (surface) toward the rear face side. In this example, shaping was performed to cause the spreading face to have an R shape and the whole side face to have a U shape as illustrated in FIG. 4.

Then, the linearity of the superconducting film-forming substrate having the side faces shaped by the shaping rolls and the flat rolls showed changes. In order to restore the flatness of the superconducting film-forming substrate, therefore, the TA treatment was performed again. Specifically, in this TA treatment, a heat treatment was performed in an atmosphere of a mixed gas of argon gas and hydrogen under a condition that the superconducting film-forming substrate was held at 650° C. which was slightly lower than a temperature at the first time and a condition that tension of 4 kgf/mm$^2$ was applied.

Then, the surface on the film-forming face side was polished by precision polishing (mechanical polishing process).

A superconducting film-forming substrate according to Example 1 was obtained as described above.

The roughness Ra of the top face, rear face, and a pair of side faces of the superconducting film-forming substrate according to Example 1 was measured by using an atomic force microscope (AFM). Results were 8.9 nm, 9.4 nm, and 38.7 nm, respectively. Furthermore, the tension test was performed on the superconducting film-forming substrate at room temperature. As a result, 0.2% proof stress was 1.6 GPa. Therefore, a superconducting film-forming substrate having high strength, low magnetism and high performance was able to be fabricated.

Furthermore the ratio of the spreading distance D2 of one spreading face in the in-plane direction P of the film-forming face (or the width direction of the substrate) to the maximum distance D1 between a pair of side faces represented by {(D2/D1)×100} was 0.005% (the spreading distance D2 is a distance between an end of the spreading face on the film-forming face side and an end of the spreading face on the rear face side in the in-plane direction P of the film-forming face, and also referred to as shoulder distance).

Then, the intermediate layer was formed on the surface (film-forming face) and the spreading face of the superconducting film-forming substrate of Example 1. In Example 1, an amorphous $Gd_2Zr_2O_{7-\delta}$ ($\delta$ is an oxygen non-stoichiometric amount) layer (bed layer), a crystalline MgO layer (forcibly oriented layer), a $LaMnO_{3+\delta}$ layer (LMO layer), and a $CeO_2$ layer (cap layer) are formed in this order as the intermediate layer by using a sputtering method, an IBAD method, a sputtering method, and a sputtering method, respectively. At this time, the layers of the intermediate layer were formed in layers along the R shape of the spreading face. The thickness of the whole intermediate layer was 0.6 μmt. Details of the film forming condition is omitted.

Then, a $YBa_2Cu_3O_{7-\delta}$ layer having a thickness of approximately 1 μmt was formed as the superconducting layer to cover the intermediate layer by using the PLD method.

Then, a silver stabilizing layer was formed to cover the superconducting layer by depositing silver so as to have a thickness of approximately 10 μmt by using a high frequency sputtering system. Thereafter, oxygen annealing was performed at 550° C. in an oxygen atmosphere.

Next, a copper stabilizing layer having a thickness of approximately 40 μmt was formed on the whole circumference of the superconducting film-forming substrate having the silver stabilizing layer by using the plating method.

A superconducting wire according to Example 1 was obtained as described above (see FIG. 4).

Examples 2 to 19

Superconducting film-forming substrate and superconducting wires according to Examples 2 to 19 were fabricated by using the same method as that for Example 1. However, the spreading faces were shaped to have a ratio of the spreading distance D2 of one spreading face in the in-plane direction P of the film-forming face (or the width direction of the substrate) to the maximum distance D1 between the pair of side faces represented by $\{(D2/D1) \times 100\}$ of the following values (the spreading distance D2 is a distance between an end of the spreading face on the film-forming face side and an end of the spreading face on the rear face side in the in-plane direction P of the film-forming face, and also referred to as shoulder distance).

Example 2: 0.010%, Example 3: 0.018%, Example 4: 0.044%, Example 5: 0.10%, Example 6: 0.150%, Example 7: 0.176%, Example 8: 0.466%, Example 9: 0.50%, Example 10: 1.00%, Example 11: 1.43%, Example 12: 2.14%, Example 13: 5.00%, Example 14: 5.61%, Example 15: 7.59%, Example 16: 11.43%, Example 17: 28.64%, Example 18: 47.74%, Example 19: 49.95%.

Comparative Example 1

Then, a superconducting film-forming substrate and a superconducting wire of Comparative Example 1 was fabricated by using a method similar to that for Example 1. However, the side face shaping at S16 illustrated in FIG. 2 was not performed. Therefore, the ratio of the shoulder distance is 0%.

<<Evaluation Method for Superconducting Characteristics>>

Then, evaluation of superconducting characteristics was performed on the obtained superconducting wires of the Examples and the Comparative example.

In the evaluation of superconducting characteristics, the critical current Ic was measured using the four-terminal method in a state in which each superconducting wire having a length of 200 m is immersed in liquid nitrogen. The measurement was performed with one meter pitch, and the voltage terminal was set to 1.2 m.

<<Evaluation Method for Exfoliation Characteristics>>

Then, evaluation of exfoliation characteristics was performed on the obtained superconducting wires of the Examples and the Comparative Example.

In the exfoliation characteristics, the adhesion state of the intermediate layer, the superconducting layer, and the stabilizing layer was confirmed by using a bend test method.

Specifically, in the bend test, a superconducting wire (thickness t=0.2 mm) formed up to the stabilizing layer was given bending strain $\epsilon=2\%$ ($\epsilon=t/\square$) once for each of both directions of the top face and the rear face of the superconducting wire with a cylindrical substance (diameter $\square=10$ mm) so as to fit the superconducting wire in the lengthwise direction with a curve of an outer circumference face of the cylindrical substance. An exfoliation state on the side faces and a surface layer of the superconducting wire was evaluated. The bend test at this time was performed under a tension-less condition in which tension was not applied to the superconducting wire.

<<Evaluation Results>>

Table 1 and Table 2 show evaluation results of superconducting characteristics and exfoliation characteristics obtained when the ratio of the shoulder distance was changed.

Absolute values of shoulder distance are shown in Tables together with the ratios of the shoulder distance.

In Table 1 and Table 2, "A" in the superconducting characteristics means that superconducting characteristics in which the critical current value exceeds 300 A in a range of all measurement points and a difference between a maximum value and a minimum value of the critical current value is within a variation range of 10 A or less were confirmed. In the superconducting characteristics, "B" means that superconducting characteristics in which the critical current value exceeds 250 A in a range of all measurement points and a difference between a maximum value and a minimum value of the critical current value is within a variation range of 30 A or less were confirmed. In the superconducting characteristics, "C" means that superconducting characteristics in which the critical current value exceeds 150 A in a range of all measurement points and a difference between a maximum value and a minimum value of the critical current value is within a variation range of 50 A or less were confirmed.

In Table 1 and Table 2, "A" in the exfoliation characteristics means that a exfoliation parts was not confirmed in a range of evaluation sample length of 1 m. In the exfoliation characteristics, "B" means that a slight exfoliation at one part or less was confirmed in the range of evaluation sample length of 1 m. In the exfoliation characteristics, "C" means that although exfoliation states were confirmed in plural parts in the range of evaluation sample length of 1 m, the total length of exfoliation parts was less than 0.5 m, i.e., the total length of exfoliation parts was less than half of the evaluation sample length. In the exfoliation characteristics, "D" means that exfoliation states were confirmed in plural parts in the range of evaluation sample length of 1 m and the total length of exfoliation parts was at least 0.5 m, i.e., the total length of exfoliation parts was at least half of the evaluation sample length.

TABLE 1

|  | Comparative example 1 | Example 1 | Example 2 | Example 3 | Example 4 | Example 5 | Example 6 | Example 7 | Example 8 | Example 9 |
|---|---|---|---|---|---|---|---|---|---|---|
| Shoulder distance (%) | 0.000 | 0.005 | 0.010 | 0.018 | 0.044 | 0.100 | 0.150 | 0.176 | 0.466 | 0.500 |
| Shoulder distance (mn) | 0.000 | 0.0005 | 0.0010 | 0.0018 | 0.0044 | 0.0100 | 0.0150 | 0.0176 | 0.0466 | 0.0500 |
| Superconducting characteristics | C | B | B | B | B | B | A | A | A | A |
| Exfoliation characteristics | D | C | D | B | B | B | A | A | A |  |

TABLE 2

|  | Example 10 | Example 11 | Example 12 | Example 13 | Example 14 | Example 15 | Example 16 | Example 17 | Example 18 | Example 19 |
|---|---|---|---|---|---|---|---|---|---|---|
| Shoulder distance (%) | 1.000 | 1.430 | 2.140 | 5.000 | 5.610 | 7.590 | 11.430 | 28.640 | 47.744 | 49.950 |
| Shoulder distance (mm) | 0.1000 | 0.143 | 0.214 | 0.500 | 0.561 | 0.759 | 1.143 | 2.864 | 4.774 | 4.955 |
| Superconducting characteristics | A | B | B | B | B | B | B | C | C | C |
| Exfoliation characteristics | A | B | B | B | B | B | C | C | C | C |

As regards the exfoliation characteristics, specifically, when the ratio of the shoulder distance was at least 0.005%, exfoliation parts in plural places were found in the evaluation sample length of 1 m, but the total length of exfoliation parts was suppressed to less than 0.5 m, i.e., less than half of the evaluation sample length. When the ratio of shoulder distance was in the range of from 0.018 to 5.00%, exfoliation could be suppressed to within one place. When the ratio of shoulder distance was in the range of from 0.15% to 1.00%, there was no exfoliation in the evaluation sample length of 1 m.

First, it was found from the results shown in Table 1 and Table 2 that exfoliation characteristics were improved in Examples 1 to 19 having a shoulder distance as compared with Comparative Example 1 having no shoulder distance. When the superconducting characteristics were also taken into consideration, it was found that the range of from 0.005 to 7.59% was preferable.

The reason why the superconducting characteristics were aggravated when the ratio of shoulder distance exceeded 7.59% was considered to be that the ratio occupied by the shoulder distance in the width direction became large and consequently the effective width of the superconducting characteristics decreased. The reason why the exfoliation characteristics were aggravated when the ratio of shoulder distance was less than 0.005% was considered to be that the shape became similar to the shape of the rectangular-shaped substrate subjected to slitting after film forming and consequently events of layer exfoliation from side faces further easily occurred.

Furthermore, it was found from the results indicated in Table 1 and Table 2 that the ratio of shoulder distance is preferably in the range of from 0.018% to 5.00% and the ratio of shoulder distance is more preferably be in the range of from 0.15% to 1.00%. In the present Examples, evaluation was performed on the basis of the shape illustrated in FIG. 4. Without being limited to this shape, however, it was confirmed that the exfoliation characteristics were improved depending upon the ratio of shoulder distance in other embodiments as well.

Disclosure of Japanese Patent Application No. 2012-092803 is incorporated herein by reference in its entirety.

All publications, patent applications, and technical standards mentioned in this specification are herein incorporated by reference to the same extent as if such individual publication, patent application, or technical standard was specifically and individually indicated to be incorporated by reference.

The invention claimed is:

1. A superconducting film-forming substrate having a tape shape, the substrate comprising:
 a film-forming face for forming a laminate including a superconducting layer thereon;
 a rear face that is a face at a side opposite to the film-forming face;
 a pair of end faces connected to the film-forming face and the rear face; and
 a pair of side faces connected to the film-forming face, the rear face, and the pair of end faces,
 wherein each of the pair of side faces comprises a spreading face that spreads toward an outer side in an in-plane direction of the film-forming face from an edge part of the film-forming face toward the rear face side.

2. The superconducting film-forming substrate according to claim 1, wherein a surface roughness of the spreading face is rougher than a surface roughness of the film-forming face.

3. The superconducting film-forming substrate according to claim 2, wherein the surface roughness of the spreading face is at least 15 nm.

4. The superconducting film-forming substrate according to claim 1, wherein a ratio of a spreading distance in each of the pair of spreading faces in the in-plane direction of the film-forming face relative to a maximum distance between the pair of side faces is in a range of from 0.005% to 7.59%.

5. The superconducting film-forming substrate according to claim 1, the substrate comprising:
 a tape-shaped substrate main body; and
 a metallic layer that covers at least both side faces of the substrate main body and that has a higher malleability than the substrate main body,
 wherein the pair of side faces are formed on the metallic layer.

6. The superconducting film-forming substrate according to claim 1, wherein the pair of side faces comprises an anchor part that is a depression provided over a lengthwise direction of the superconducting film-forming substrate.

7. The superconducting film-forming substrate according to claim 1, wherein:
the spreading face that spreads from the edge part of the film-forming face is designated as a first spreading face, and
the pair of side faces further comprises a second spreading face that spreads toward an outer side in the in-plane direction of the film-forming face from an edge part of the rear face toward the first spreading face.

8. The superconducting film-forming substrate according to claim 1, wherein the pair of side faces comprises a perpendicular face that is connected to the spreading face and that is perpendicular to the rear face.

9. A superconducting wire, comprising:
the superconducting film-forming substrate according to claim 1;
an intermediate layer disposed on the film-forming face of the superconducting film-forming substrate and on at least the spreading face on the pair of side faces; and
a superconducting layer disposed on a surface of the intermediate layer.

10. The superconducting wire according to claim 9, wherein the superconducting layer comprises: a superconducting part located over the film-forming face and having, as a main component, an oxide superconductor that forms a superconducting phase; and a normal conducting part located over the spreading face and including an oxide superconductor that forms a normal conducting phase.

11. The superconducting wire according to claim 9, wherein the superconducting layer extends further toward an outer side in an in-plane direction of the spreading face than the intermediate layer and covers end faces of the intermediate layer.

12. A superconducting wire manufacturing method, comprising:
a working process of working a superconducting film-forming substrate having a tape shape, the substrate comprising a film-forming face for forming a laminate including a superconducting layer thereon, a rear face that is a face at a side opposite to the film-forming face, a pair of end faces connected to the film-forming face and the rear face, and a pair of side faces connected to the film-forming face and the rear face, so as to shape a spreading face that spreads toward an outer side in an in-plane direction of the film-forming face from an edge part of the film-forming face toward the rear face side, on each of the pair of side faces;
an intermediate layer forming process of forming an intermediate layer on the film-forming face of the superconducting film-forming substrate and on at least the spreading face on the pair of side faces, after the working process; and
a superconducting layer forming process of forming a superconducting layer on a surface of the intermediate layer.

13. The superconducting wire manufacturing method according to claim 12, wherein:
the working process comprises a covering process of covering the pair of side faces of a tape-shaped substrate main body with a metallic layer that has a higher malleability than the substrate main body, to obtain the superconducting film-forming substrate, and
the metallic layer of the obtained superconducting film-forming substrate is worked to shape a spreading face on each of the pair of side faces.

14. The superconducting wire manufacturing method according to claim 12, the method comprising a process of conducting a heat treatment on a superconducting layer part located over the spreading face to bring the superconducting layer part located over the spreading face into a non-superconducting state, after the superconducting layer forming process.

* * * * *